United States Patent [19]
Pedersen et al.

[11] Patent Number: 5,861,760
[45] Date of Patent: *Jan. 19, 1999

[54] PROGRAMMABLE LOGIC DEVICE MACROCELL WITH IMPROVED CAPABILITY

[75] Inventors: Bruce B. Pedersen; John C. Costello, both of San Jose, Calif.

[73] Assignee: Altera Corporation, San Jose, Calif.

[ * ] Notice: The term of this patent shall not extend beyond the expiration date of Pat. No. 5,598,108.

[21] Appl. No.: 766,512

[22] Filed: Dec. 13, 1996

Related U.S. Application Data

[60] Provisional application No. 60/026,915 Sep. 24, 1996.

Related U.S. Application Data

[63] Continuation-in-part of Ser. No. 605,445, Feb. 26, 1996, Pat. No. 5,598,108, which is a continuation of Ser. No. 331,964, Oct. 31, 1994, Pat. No. 5,557,217, which is a continuation of Ser. No. 123,435, Sep. 17, 1993, Pat. No. 5,384,499, which is a continuation-in-part of Ser. No. 43,146, Mar. 31, 1993, Pat. No. 5,268,598, which is a continuation of Ser. No. 957,091, Oct. 6, 1992, abandoned, which is a continuation of Ser. No. 691,640, Apr. 25, 1991, Pat. No. 5,241,224.

[51] Int. Cl.⁶ .............................................. H03K 19/173
[52] U.S. Cl. ............................................ 326/39; 326/521
[58] Field of Search .......................................... 326/38–41

[56] References Cited

U.S. PATENT DOCUMENTS

| | | | |
|---|---|---|---|
| 4,742,252 | 5/1988 | Agrawal ..................................... | 326/39 |
| 4,758,746 | 7/1988 | Birkner et al. .......................... | 307/465 |
| 4,789,951 | 12/1988 | Birkner et al. ............................. | 326/39 |
| 4,864,161 | 9/1989 | Norman et al. ....................... | 307/272.2 |
| 4,871,930 | 10/1989 | Wong et al. ............................. | 307/465 |
| 4,879,481 | 11/1989 | Pathak et al. ....................... | 307/468 X |
| 4,903,223 | 2/1990 | Norman et al. ............................ | 326/39 |
| 4,912,345 | 3/1990 | Steele et al. ............................. | 307/465 |
| 4,918,641 | 4/1990 | Jigour et al. ........................ | 307/465 X |
| 4,942,319 | 7/1990 | Pickett et al. .......................... | 326/39 X |
| 4,983,959 | 1/1991 | Breuninger ........................... | 307/465 X |
| 5,003,202 | 3/1991 | Keida ................................... | 307/469 X |
| 5,027,315 | 6/1991 | Agrawal et al. .......................... | 326/38 |
| 5,053,646 | 10/1991 | Higuchi et al. .......................... | 307/465 |
| 5,079,451 | 1/1992 | Gudger et al. ............................. | 326/41 |
| 5,168,177 | 12/1992 | Shankar et al. ........................... | 326/39 |
| 5,191,243 | 3/1993 | Shen et al. ................................ | 326/39 |
| 5,231,312 | 7/1993 | Gongwer et al. ..................... | 326/41 X |
| 5,260,610 | 11/1993 | Pedersen et al. .......................... | 326/41 |
| 5,414,376 | 5/1995 | Hawes .................................. | 326/39 X |
| 5,598,108 | 1/1997 | Pedersen .................................. | 326/41 |

OTHER PUBLICATIONS

Altera Max EPLD Family Architecture data sheet, Altera Corporation, Jan. 1990, pp. 1–5.

Advanced Micro Devices MACH 1 and MACH 2 Families data sheet, Advanced Micro Devices, Inc., Apr. 1991, pp. 1–7, 14, 15, 28, 29.

Plus Logic FPGA2020 data sheet, Plus Logic, Inc., date unknown, pp. 1–7.

*MACH 3 and 4 Family Data Book,* 1993, Advanced Micro Devices, Inc., Sunnyvale, CA.

*Primary Examiner*—Jon Santamauro
*Assistant Examiner*—Don Phu Le
*Attorney, Agent, or Firm*—Fish & Neave; Robert R. Jackson

[57] ABSTRACT

A macrocell for a programmable logic device includes circuitry for allowing a neighboring macrocell to borrow various numbers of the product terms of the macrocell. The macrocell can continue to make full use of its product terms that are not thus borrowed. This includes logically combining and registering the unborrowed product terms. The macrocell may include circuitry for feeding back to the AND array of the programmable logic device a combinatorial or registered signal of the macrocell, and also outputting such a combinatorial or registered signal from the macrocell. When a combinatorial signal is fed back, the register of the macrocell can be used for another signal of the macrocell.

23 Claims, 2 Drawing Sheets

5,861,760

PROGRAMMABLE LOGIC DEVICE MACROCELL WITH IMPROVED CAPABILITY

CROSS REFERENCE TO RELATED APPLICATIONS

This application claims the benefit of provisional application No. 60/026,915, filed Sep. 24, 1996. This application is also a continuation-in-part of application Ser. No. 08/605,445, filed Feb. 26, 1996, now U.S. Pat. No. 5,598,108, which was a continuation of co-pending U.S. patent application Ser. No. 08/331,964, filed Oct. 31, 1994, now U.S. Pat. No. 5,557,217, which was a continuation of U.S. patent application Ser. No. 08/123,435, filed Sep. 17, 1993, now U.S. Pat. No. 5,384,499, which was a continuation-in-part of U.S. patent application Ser. No. 08/043,146, filed Mar. 31, 1993, now U.S. Pat. No. 5,268,598, which was a continuation of U.S. patent application Ser. No. 07/957,091, filed Oct. 6, 1992, now abandoned, which was a continuation of U.S. patent application Ser. No. 07/691,640, filed Apr. 25, 1991, now U.S. Pat. No. 5,241,224.

BACKGROUND OF THE INVENTION

This invention relates to programmable logic integrated circuit devices, and more particularly to improved logic macrocells for such devices.

Pedersen U.S. Pat. No. 5,598,108, (hereby incorporated by reference herein) shows a macrocell for programmable logic devices which can form the sum of five product terms and output that sum, either directly or through a register. If a wider fan-in function is needed, the sum formed by one macrocell can be "borrowed" by a neighboring macrocell for combination (i.e., summation) with the five-product-term sum formed by the neighboring macrocell. When the product terms of a macrocell are thus borrowed by a neighboring macrocell, the other resources (e.g., the register) of the first macrocell become unusable. The potential waste of resources is even greater if less than all of the first macrocell's product term resources need to be borrowed.

It is known to make it possible for a macrocell to output one of its product terms (either registered or unregistered) if that product term is not needed for borrowing, even though other product terms of the macrocell are being borrowed. (See, for example, *MACH 3 and 4 Family Data Book*, 1993, Advanced Micro Devices, Inc., Sunnyvale, Calif.) However, no complex sum of products function can be implemented by a macrocell from which any of the product terms need to be borrowed.

In view of the foregoing, it is an object of this invention to increase the flexibility with which product terms of a macrocell can be borrowed by another macrocell or (if not borrowed) put to use in the macrocell of which they are nominally a part.

It is also known to feed back to the AND array of a programmable logic device a signal produced by a macrocell. This enables a macrocell to be used to implement a function that is needed by other macrocells to implement more complex functions. However, the ability to feed back only one signal produced by a macrocell may mean that other resources of the macrocell are wasted.

It is therefore another object of this invention to reduce or eliminate possible waste of macrocell resources due to macrocell architectures in which only one signal produced by a macrocell can be fed back to the AND array of the associated programmable logic device.

SUMMARY OF THE INVENTION

These and other objects of the invention are accomplished in accordance with the principles of the invention by providing macrocells in which different numbers of the product terms can be borrowed by a neighboring macrocell, and the product terms that are not thus borrowed can continue to be put to full use in the macrocell that nominally includes them. For example if a macrocell nominally includes five product terms, the number of borrowed product terms may be zero, two, three, or five. If zero product terms are borrowed, then the macrocell may sum all five of its product terms and output that sum, either directly or through the register of that macrocell. If two product terms are borrowed, then the remaining three may be summed and output (directly or through the register) by the macrocell. If three product terms are borrowed, the remaining two may be summed and output (directly or through the register) by the macrocell. In this way each macrocell can continue to implement sum of products functions even when some of its product terms are being borrowed.

In accordance with another aspect of the invention, either the combinatorial (i.e., sum of products) signal or the registered signal produced by a macrocell can be fed back to the AND array of the associated programmable logic device. A registered or unregistered signal produced by the macrocell can be the output signal of the macrocell. This provides feedback flexibility concurrent with usability (to provide another macrocell output) of macrocell resources that may not be involved in producing the feedback signal.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
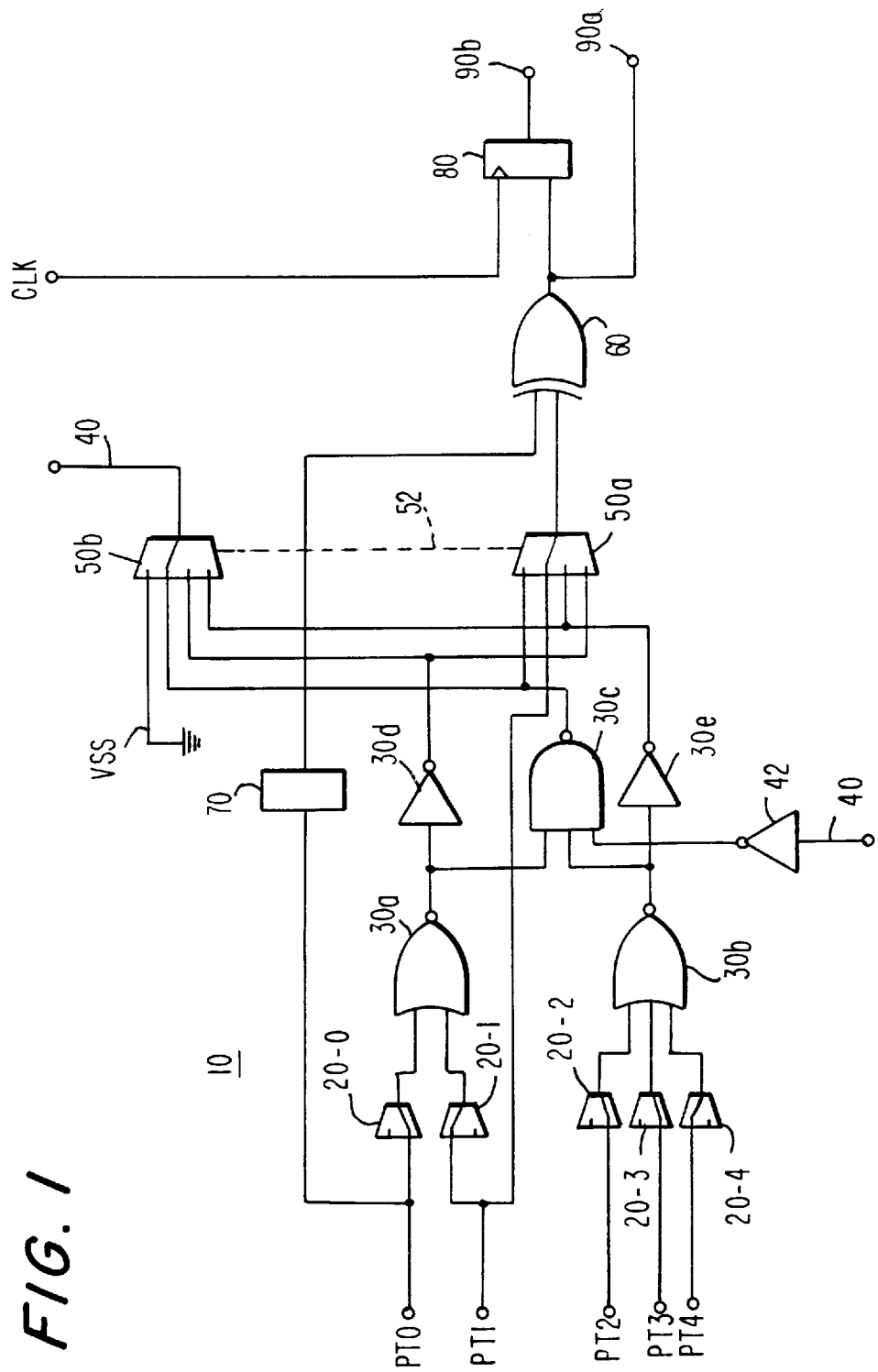
FIG. 1 is a simplified schematic block diagram of an illustrative embodiment of a representative programmable logic device macrocell constructed in accordance with the invention.

The illustrative macrocell 10 shown in FIG. 1 has five product terms PT0, PT1, PT2, PT3, and PT4 as primary inputs. These product terms are generated in a programmable AND array which is not shown in FIG. 1 but which can be entirely conventional. (A representative portion of a programmable AND array is shown at 120 in FIG. 2.) A programmable logic connector ("PLC") 20-0 through 20-4 is respectively associated with each of product terms PT0–PT4 for selectively passing or tying off the associated product term upstream from NOR gates 30a and 30b.

NOR gate 30a logically combines the outputs of PLCs 20-0 and 20-1 and applies the resulting signal to NAND gate 30c and inverter 30d. NOR gate 30b logically combines the outputs of PLCs 20-2, 20-3, and 20-4 and applies the resulting signal to NAND gate 30c and inverter 30e. The third input to NAND gate 30c is an inverted "allocate in" signal 40 from another macrocell, which may be similar and adjacent to (or otherwise a neighbor of) macrocell 10. The manner in which the other macrocell produces signal 40 will be apparent from the following explanation of how macrocell 10 produces its "allocate out" signal 40, because the "allocate in" signal of each macrocell is the "allocate out" signal of another macrocell. Inverter 42 performs the above-mentioned inversion of "allocate in" signal 40.

NAND gate 30c logically combines the signals applied to it and applies the resulting signal to one input terminal of each of PLCs 50a and 50b. The output signal of inverter 30d is applied to another input terminal of each of PLCs 50a and 50b. The output signal of inverter 30e is applied to still another input terminal of each of PLCs 50a and 50b. The fourth input to PLC 50a is one of the product terms of the macrocell (i.e., PT1). The fourth input to PLC 50b is VSS (logic 0).

Each of PLCs 50a and 50b is programmable to select one of its inputs for transmission to its output terminal. In the most preferred embodiments PLCs 50a and 50b have shared or common configuration bits (also sometimes referred to as function control elements ("FCEs")) so that there is a predetermined relationship between the input selections of PLCs 50a and 50b. This sharing of FCEs (indicated by dotted line 52) helps to reduce the number of FCEs that are required on the device. In alternative embodiments it may be preferred to have PLCs 50a and 50b wholly or at least partly independently programmable, thereby making the signal selections of PLCs 50a and 50b wholly or partly independent of one another.

The output signal of PLC 50a is applied to one input terminal of EXCLUSIVE OR ("XOR") gate 60. The other input to XOR gate 60 is the output signal of invert logic 70. Invert logic 70 is programmable to control possible inversion of the output signal of PLC 50a by XOR gate 60. To perform this function, invert logic 70 may make use of one of the product terms of the macrocell (i.e., PT0). In other words, inversion of the output signal of PLC 50a by XOR gate 60 may be based in whole or in part on the logic level of PT0.

The output signal of XOR gate 60 is applied to the combinatorial output terminal 90a of macrocell 10, and also to the data input terminal of a register 80 (e.g., a flip-flop) which is part of the macrocell. Register 80 also receives a clock signal. Register 80 can store the signal applied to its data input terminal, and it applies the stored signal to the registered output terminal 90b of macrocell 10.

It will be seen from the foregoing that PLC 50a can select any of the following signals for application to XOR gate 60: (1) PT1, (2) the output of inverter 30d (which is a logical combination of PT0 and PT1), (3) the output of inverter 30e (which is a logical combination of PT2, PT3, and PT4), or (4) the output of NAND gate 30c (which is a logical combination of PT0–PT4 and inverted "allocate in" signal 40). Thus macrocell 10 can be used to provide output signals 90 which are dependent on either one of its product terms (PT1), two of its product terms (PT0 and PT1), three of its product terms (PT2–PT4), or all five of its product terms and its allocate in signal 40.

PLC 50b can select any of the following signals for application to the allocate out lead 40 of the macrocell: (1) VSS (logic 0), (2) the output signal of inverter 30d (which is a logical combination of PT0 and PT1), (3) the output signal of inverter 30e (which is a logical combination of PT2–PT4), or (4) the output signal of NAND gate 30c (which is a logical combination of PT0–PT4 and inverted "allocate in" signal 40). Thus the neighboring macrocell that receives as its "allocate in" signal 40 the "allocate out" signal 40 of depicted macrocell 10 can "borrow" two (PT0 and PT1), three (PT2–PT4), or all five (PT0–PT4) of the product terms of macrocell 10. If two of the product terms of macrocell 10 are thus borrowed by a neighboring macrocell, macrocell 10 can still continue to perform logical operations based on combination of the three remaining product terms PT2–PT4. If three product terms are borrowed, macrocell 10 can still continue to perform logical operations based on combination of the two remaining product terms PT0 and PT1. Even if all five product terms are borrowed, macrocell 10 can still be used to output and/or register and output product term PT1. Macrocell 10 is therefore considerably more flexible than prior art macrocells with regard to borrowing and continued use of unborrowed product terms.

Figure 2:
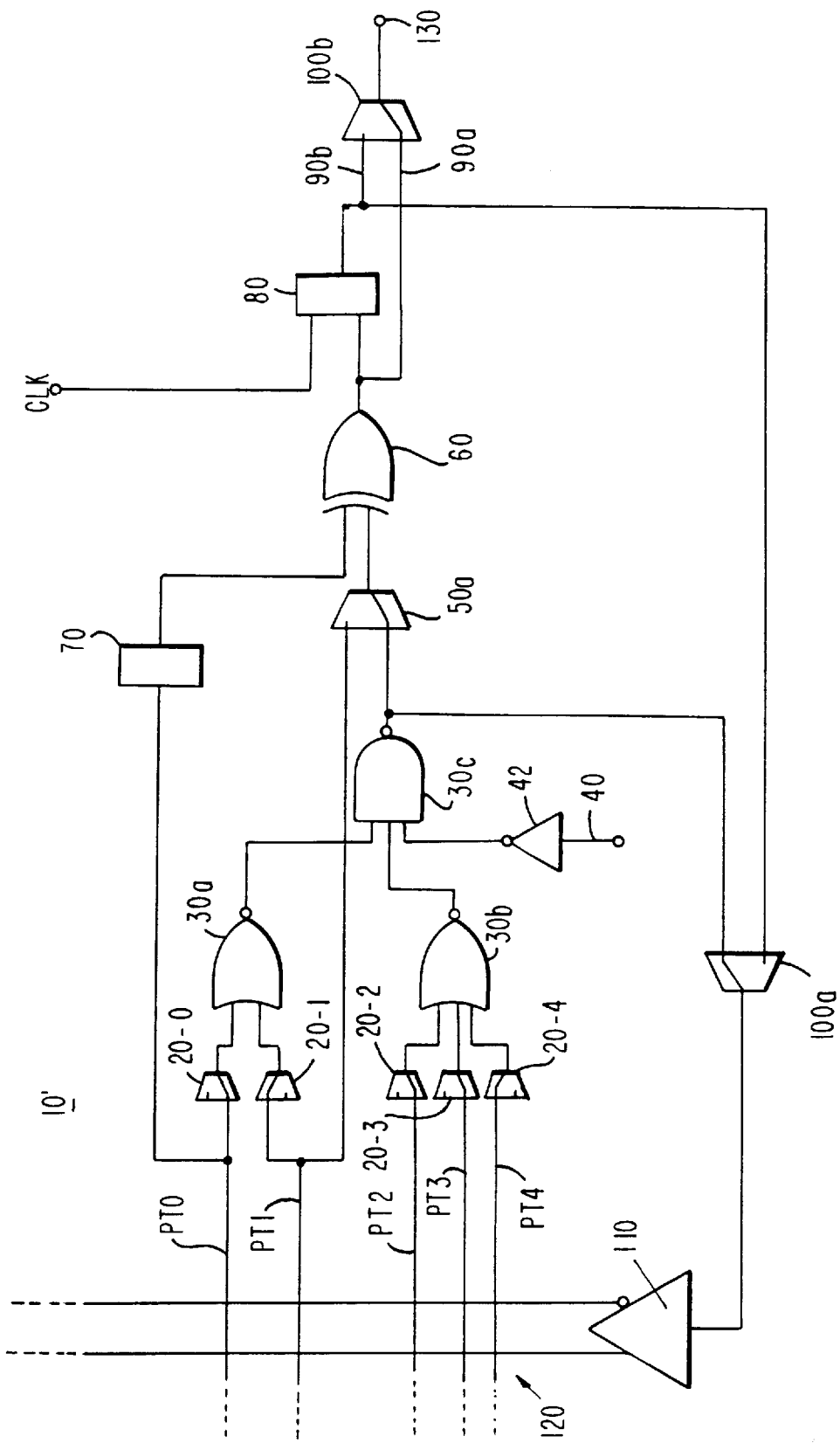
FIG. 2 is a simplified schematic block diagram of another illustrative embodiment of a representative programmable logic device macrocell constructed in accordance with the invention.

FIG. 2 illustrates another aspect of this invention. Elements in FIG. 2 that are the same as or similar to elements in FIG. 1 have the same reference numbers in both FIGS. It will therefore not be necessary to describe those elements again in connection with FIG. 2. Some elements from FIG. 1 are not shown again in FIG. 2. It will be understood, however, that those elements (e.g., 30d, 30e, 50b, and a larger PLC 50a) can be included in the FIG. 2 circuitry if desired.

In the illustrative macrocell 10' shown in FIG. 2 the output signal of NAND gate 30c is additionally applied to one input terminal of PLC 100a. The output signal 90b of register 80 is applied to the other input terminal of PLC 100a and to one input terminal of PLC 100b. The output signal 90a of XOR gate 60 is applied to the other input terminal of PLC 100b.

PLC 100a is programmable to select either of its inputs for transmission to its output terminal. The output signal of PLC 100a is applied to word line driver 110, which drives the true and complement of the applied signal onto respective true and complement word lines in programmable AND array 120. Thus PLC 100a allows either the combinatorial output signal (from NAND gate 30c) or the registered output signal 90b of macrocell 10' to be fed back to the AND array 120 of the programmable logic device. (Note that when PLC 50a is programmed to connect NAND gate 30c to XOR gate 60, the output of NAND gate 30c is either the same as or the inverse of signal 90a. Thus the output of NAND gate 30c is effectively the normal combinatorial output 90a of the macrocell, bearing in mind that driver 110 drives both the true and complement of the applied signal into AND array 120.) Similarly, PLC 100b allows either the combinatorial output signal 90a or the registered output signal 90b to be the final output 130 of the macrocell.

Another advantage of macrocell 10' which should be noted is as follows. A combinatorial signal produced by NAND gate 30c can be fed back to AND array 120 via PLC 100a, and at the same time register 80 can be used to register either that combinatorial signal (if PLC 50a connects elements 30c and 60) or PT1 (if PLC 50a connects PT1 to XOR gate 60). The register resource 80 of macrocell 10' is therefore not necessarily wasted when the macrocell is used for combinatorial signal feedback. Register 80 can still be used to register PT1 if desired.

The foregoing demonstrates that, as compared to the prior art, macrocell 10' has greater feedback and output flexibility, as well as greater potential use of both the combinatorial and register resources of the macrocell.

Various technologies can be used to implement programmable logic devices employing the macrocells of this invention, as well as the various components of those macrocells (e.g., AND array 120, the PLCs, and the FCEs which control the AND array and the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the number of product terms nominally associated with each macrocell can be more or less than the five product terms shown in FIGS. 1 and 2. Also, the way in which those product terms are subdivided into groups that can be allocated to (borrowed by) a neighboring macrocell can differ from the examplary subdivisions shown in FIG. 1. (The FIG. 1 subdivisions referred to are (1) PT0 and PT1, (2) PT2–PT4, or (3) PT0–PT4 and "allocate in" 40.) Additional product terms may be associated with each macrocell for other functions such as to provide an asynchronous clock for register 80 (as an alternative to the depicted clock signal, which is assumed to be synchronous).

The invention claimed is:

1. Macrocell circuitry for a programmable logic device comprising:

a plurality of product term circuits, each of which produces a respective product term signal;

product term utilization circuitry for using product term signals to produce a macrocell output signal; and programmable switching circuitry for allowing a plurality of different non-zero numbers of said product term signals to be used as product term signals by product term utilization circuitry of another macrocell on said programmable logic device, and for allowing product terms that are not thus used by said another macrocell to be used as product term signals by said product term utilization circuitry which produces said macrocell output signal.

2. The circuitry defined in claim 1 wherein said switching circuitry additionally allows a product term used by said another macrocell to be used as a product term signal by said product term utilization circuitry which produces said macrocell output signal.

3. The circuitry defined in claim 1 wherein said non-zero numbers include the numbers two and three.

4. The circuitry defined in claim 1 wherein said non-zero numbers include the numbers two, three, and five.

5. The circuitry defined in claim 1 wherein said programmable switching circuitry allows a multiplicity of different numbers of said product term signals to be used as product term signals by said product term utilization circuitry which produces said macrocell output signal.

6. The circuitry defined in claim 5 wherein said multiplicity of different numbers includes at least two non-zero numbers.

7. The circuitry defined in claim 6 wherein said multiplicity of different numbers includes the numbers two and three.

8. The circuitry defined in claim 7 wherein said multiplicity of different numbers also includes the number one.

9. The circuitry defined in claim 8 wherein said multiplicity of different numbers also includes the number five.

10. The circuitry defined in claim 1 wherein said product term utilization circuitry which produces said macrocell output signal comprises:

combinatorial circuitry for logically combining product term signals.

11. The circuitry defined in claim 1 wherein said product term utilization circuitry which produces said macrocell output signal comprises:

register circuitry for registering a signal indicative of one or more product term signals.

12. The circuitry defined in claim 1 further comprising:

first combinatorial circuitry for logically combining a first subplurality of said product term signals to produce a first combinatorial signal, said programmable switching circuitry selectively applying said first combinatorial signal to said product term utilization circuitry of said another macrocell.

13. The circuitry defined in claim 12 further comprising:

second combinatorial circuitry for logically combining a second subplurality of said product term signals to produce a second combinatorial signal, said programmable switching circuitry selectively applying said second combinatorial signal to said product term utilization circuitry of said another macrocell.

14. The circuitry defined in claim 13 wherein said first and second subpluralities are mutually exclusive of one another.

15. The circuitry defined in claim 13 further comprising:

third combinatorial circuitry for logically combining said first and second combinatorial signals to produce a third combinatorial signal, said switching circuitry selectively applying said third combinatorial signal to said product term utilization circuitry of said another macrocell.

16. Programmable logic device circuitry including a plurality macrocells, each of said macrocells comprising:

a plurality of product term circuits, each of which produces a respective product term signal;

first combinatorial circuitry for logically combining a first subplurality of said product term signals to produce a first combinatorial signal;

second combinatorial circuitry for logically combining a second subplurality of said product term signals to produce a second combinatorial signal;

third combinatorial circuitry for logically combining said first and second combinatorial signals and an allocate out signal from another of said macrocells;

signal utilization circuitry for using an applied signal to produce an output signal of said macrocell; and switching circuitry which is programmable to select one of said first, second, and third combinatorial signals as an allocate out signal of said macrocell and to select one of said first, second, and third combinatorial signals as the signal applied to said signal utilization circuitry.

17. The circuitry defined in claim 16 wherein said first and second subpluralities are mutually exclusive of one another.

18. The circuitry defined in claim 17 wherein said first subplurality consists of two of said product term signals, and wherein said second subplurality consists of three of said product term signals.

19. The circuitry defined in claim 16 wherein said signal utilization circuitry comprises:

a register for registering a signal indicative of the signal applied to said signal utilization circuitry.

20. The circuitry defined in claim 19 wherein said signal utilization circuitry further comprises:

programmable selection circuitry for selecting as said output signal of said macrocell either a signal indicative of the signal applied to said signal utilization circuitry or the signal registered by said register.

21. The circuitry defined in claim 16 wherein said switching circuitry is further programmable to select one of said product term signals prior to processing by any of said combinatorial circuitries as the signal applied to said signal utilization circuitry.

22. Macrocell circuitry for a programmable logic device comprising:

a programmable array having a plurality of inputs and a plurality of outputs, each of said outputs being a programmable logical function of selected ones of said inputs;

combinatorial circuitry for logically combining said outputs to produce a combinatorial signal;

register circuitry for receiving and registering a signal dependent on at least one of said outputs and for producing a registered signal which is indicative of the signal received and registered by said register circuitry;

a first programmable logic connector for applying to an input of said programmable array a feedback signal indicative of either said combinatorial signal or said registered signal;

a second programmable logic connector for outputting from said macrocell circuitry an output signal indicative of either said signal dependent on at least one of said outputs or said registered signal; and programmable switching circuitry for selecting as said signal dependent on at least one of said outputs either a signal indicative of said combinatorial signal or a signal indicative of one of said outputs of said programmable array prior to combination with other outputs of said programmable array, said first programmable logic connector being connected so that it can select said combinatorial signal even if said programmable switching circuitry is not selecting a signal indicative of said combinatorial signal.

23. The circuitry defined in claim 22 wherein said first programmable logic connector applies to respective inputs of said programmable array both the true and the complement of said feedback signal.

* * * * *